United States Patent [19]

Hirata

[11] Patent Number: 4,661,978

[45] Date of Patent: Apr. 28, 1987

[54] SUBSCRIBER LINE INTERFACE CIRCUIT HAVING AN IMPEDENCE SYNTHESIZER

[75] Inventor: Hideyuki Hirata, Tokyo, Japan

[73] Assignee: NEC Corporation, Japan

[21] Appl. No.: 686,254

[22] Filed: Dec. 26, 1984

[30] Foreign Application Priority Data

Dec. 28, 1983 [JP] Japan ............................. 58-247035

[51] Int. Cl.⁴ ............................................ H04M 1/76
[52] U.S. Cl. ...................................... 379/394; 330/69;
330/151; 330/258; 330/260; 379/399
[58] Field of Search ......... 179/16 F, 16 AA, 170 NC,
179/170 R, 18 FA, 170 D, 81 R; 330/69, 151,
252, 260, 126, 258; 333/213

[56] References Cited

U.S. PATENT DOCUMENTS

| | | | |
|---|---|---|---|
| 4,203,009 | 5/1980 | Tattersall | 179/16 AA |
| 4,387,273 | 6/1983 | Chea, Jr. | 179/16 F |
| 4,476,350 | 10/1984 | Aull et al. | 179/70 |

FOREIGN PATENT DOCUMENTS 0073589  5/1982  Japan ........................... 179/170 NC Primary Examiner—Gene Z. Rubinson
Assistant Examiner—R. Vaas
Attorney, Agent, or Firm—Laff, Whitesel, Conte & Saret

[57] ABSTRACT

A subscriber line interface circuit described wherein a pair of line terminals are connected to a subscriber loop and a pair of output terminals are connected to a telecommunication exchange. A first amplifier is provided having a first pair of input terminals coupled to the line terminals and a second pair of input terminals. The first amplifier has a unity gain over a path from the input terminals of the first pair to said output terminals and a gain K over a path from the terminals of the second pair to said output terminals. A pair of reference resistors are cross-coupled from said output terminals to the line terminals, each of the reference resistors having a resistance Ro. A second amplifier is connected from the line terminals to the terminals of the second pair, the second amplifier having a transfer function $-Ro/K \cdot Zt$, where $Zt$ is an impedance to be synthesized across the line terminals.

8 Claims, 4 Drawing Figures

SUBSCRIBER LINE INTERFACE CIRCUIT HAVING AN IMPEDENCE SYNTHESIZER

BACKGROUND OF THE INVENTION

The present invention relates to a subscriber line interface circuit for telecommunication switching systems, and more particularly to a line interface circuit having an impedance synthesizer for synthesizing a termination impedance of the subscriber line.

Subscriber line interface circuits are required to feed loop current as well as to synthesize a termination impedance for signal transmission.

The impedance synthesizer, as shown and described in U.S. patent application Ser. No. 565,975, filed Dec. 27, 1983, comprises a pair of output power amplifiers that drive a pair of reference resistors coupled respectively to input terminals, an amplifier for detecting an input voltage, and an impedance synthesizer for synthesizing a termination impedance. The impedance $Z_{in}$ as seen from the input terminals is given by:

$$Z_{in} = 2R_o/(1-G_1)$$

where $R_o$ is the resistance value of the reference resistors, and $G_1$ is the transfer function of the output power amplifiers which is selected so that $Z_{in} = Z_t$ where $Z_t$ is a desired impedance value. The transfer function is given by:

$$G_1 = 1 - (Z_t/2R_o)$$

To simplify circuitry, the power amplifiers are split into a first feedback loop having a unity loop gain in which high precision is required and a second feedback loop having a loop gain of $-Z_t/2R_o$ in which precision is not required, so that overall precision is improved. However, two operational amplifiers of high precision are still required. Particularly, in the case of an interface circuit of the type having a balanced output, at least three high precision operational amplifiers are required and each operational amplifier must meet tight tolerances and wide bandwidth frequency response requirement.

SUMMARY OF THE INVENTION

Accordingly, an object of the present invention is to provide a subscriber line interface circuit having an impedance synthesizer which requires only one high precision, wide-band operational amplifier.

A subscriber line interface circuit according to the present invention has a pair of line terminals adapted to be connected to a subscriber loop and a pair of output terminals adapted to be connected to a telecommunication exchange. The interface circuit comprises a first amplifier having a first pair of input terminals coupled to the line terminals, a second pair of input terminals, the first amplifier having a unity gain over a path from the input terminals of the first pair to said output terminals and a gain K over a path from the terminals of the second pair to said output terminals. A pair of reference resistors are connected from said output terminals to the line terminals, each of the reference resistors having a resistance $R_o$. Further included is a second amplifier connected from the line terminals to the terminals of the second pair, the second amplifier having a transfer function $-R_o/K \cdot Z_t$, where $Z_t$ is an impedance to be synthesized across the line terminals.

In a practical aspect of the present invention, the first amplifier requires a high precision, wide-band operational amplifier, whereas the second amplifier requires operational amplifiers of the type having lower degree of precision.

BRIEF DESCRIPTION OF THE DRAWINGS

The present invention will be described in further detail with reference to the accompanying drawings, in which.

DETAILED DESCRIPTION

Figure 1:
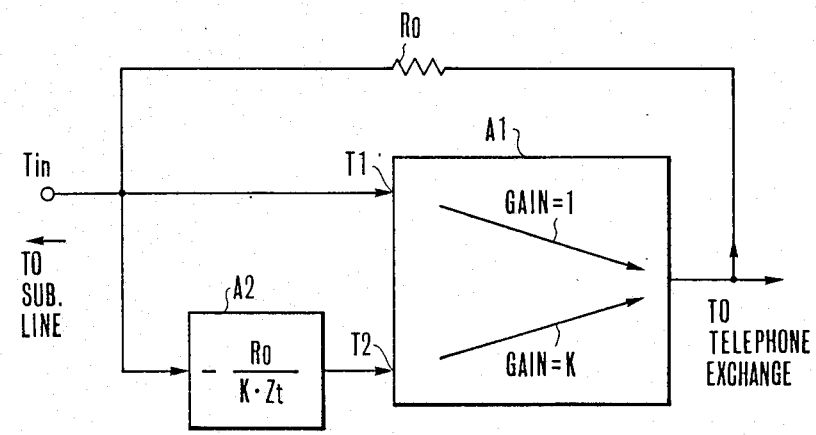
FIG. 1 is an illustration of a schematic block diagram of the subscriber line interface circuit of the present invention.

FIG. 1 is a block diagram of a basic circuit structure of the subscriber line interface circuit of the present invention. The interface circuit includes a first amplifier A1 has a unity gain over a path between a first input terminal T1 and an output terminal TO and a gain K over a path between a second input terminal T2 and the output terminal TO. The output terminal of amplifier A1 is connected by a reference resistor $R_o$ to an input terminal Tin to the first input terminal T1 is connected. Between terminals Tin and T2 is connected a second amplifier A2 having a transfer function $-R_o/(K \cdot Z_t)$, where $Z_t$ is a desired impedance value. Each of the first and second amplifiers A1, A2 has a high input impedance so that impedance $Z_{in}$ as seen from input terminal Tin equals the desired impedance $Z_t$.

Figure 2:
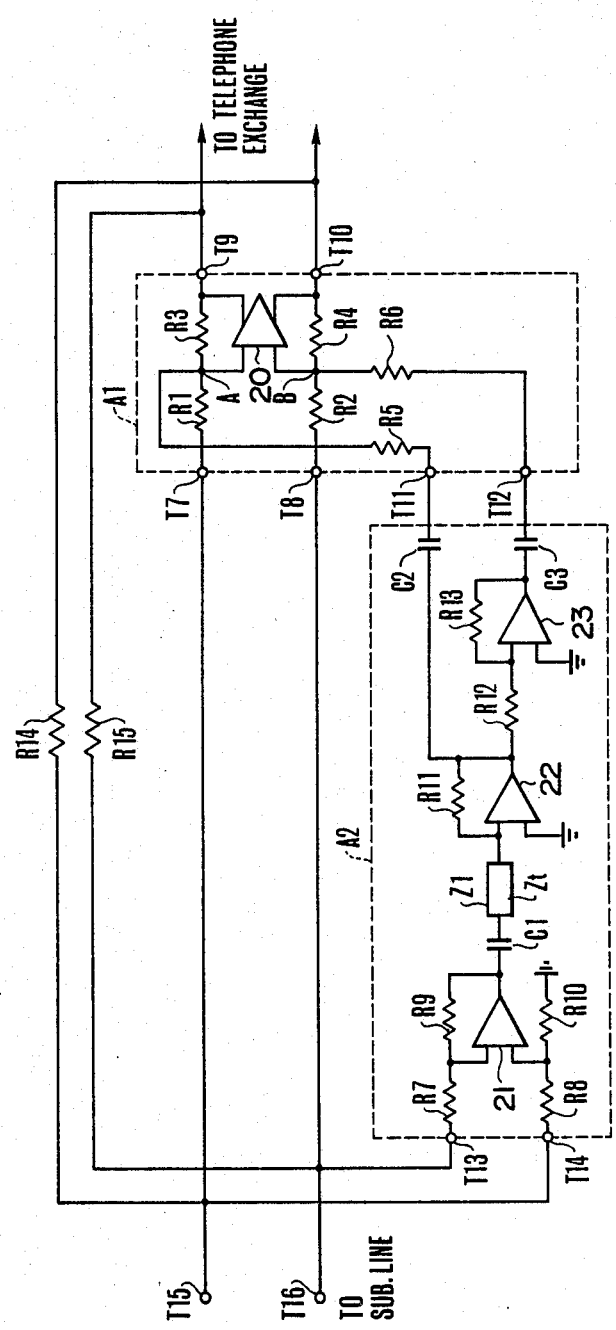
FIG. 2 is a circuit diagram of an embodiment of the present invention.

Details of the circuit of FIG. 1 are illustrated in FIG. 2. For purposes of illustration, the interface circuit is provided in a balanced network. The first amplifier A1 is in a differential-input differential-output configuration and comprises an operational amplifier 20 and resistors R1 through R6, all of which have equal resistance values.

Resistors R1 and R3 are connected in series between an input terminal T7 and an output terminal T9 and resistors R2 and R4 are likewise connected in series between an input terminal T8 and an output terminal T10, the input terminals T7 and T8 being connected to a subscriber loop through terminals T15 and T16 and the output terminals T9 and T10 being connected to the associated subscriber line circuit of a telecommunication exchange and cross-coupled by reference resistors R15 and R14 to line terminals T16 and T15, respectively. These reference resistors are of equal resistance values of $R_o$. Operational amplifier 20 has a pair of input terminals coupled respectively to a junction A between resistors R1 and R3 and to a junction B between resistors R2 and R4 and has a pair of output terminals coupled respectively to terminals T9 and T10. Resistors R5 and R6 are connected respectively from terminals T11 and T12 to junctions A and B. In order for an output voltage developed across terminals T9 and T10 to be symmetrical with respect to reference, or ground potential, the amplifier A1 provides unity gain amplification between terminals T7 and T9 and between terminals T8 and T10. Amplifier A1 provides dual functions of output power drive and input voltage detection using a single operational amplifier 20.

Amplifier A2 comprises operational amplifiers 21, 22 and 23. Terminal T15 is connected through terminal T14, resistors R8 and R10 to ground potential and terminal T16 is connected through terminal T13, resistors R7 and R9 to the output of operational amplifier 21. Amplifier 21 is a differential amplifier having a pair of input terminals coupled respectively to a junction between resistors R7 and R9 and to a junction between resistors R8 and R10. A differential component of the line voltage developed across terminals T15 and T16 with respect to ground potential is detected by amplifier 21 and applied through a capacitor C1 and an impedance circuit Z1 to one input of operational amplifier 22 whose output is coupled by a feedback resistor R11 to one input of amplifier 22, the other input thereof being connected to ground. The impedance circuit Z1 has an impedance value Zt. A voltage developed at the output of amplifier 22 is represented by $-Ro/Zt$, which is applied through a capacitor C2 to terminal T11. This voltage is inverted by a unity gain inverting amplifier circuit formed by amplifier 23, resistors R12 and R13 and applied through a capacitor C3 to terminal T12.

The amplifier A1, which requires high precision quality and wide bandwidth response, is therefore constructed by a single summing amplifier 20 in a balanced differential-input differential-output amplifier configuration by having it perform dual functions of power drive and input detection. Another feature of the invention is that resistors R1 to R4 are not required to be of high precision type; only their relative values must be precisely determined. This is particularly advantageous for intergrated circuit fabrication.

In the FIG. 2 embodiment, the impedance synthesis is obtained by a balanced circuit. However, an imbalanced impedance synthesizer could also be constructed easily based on the structure of FIG. 1.

Figure 3:
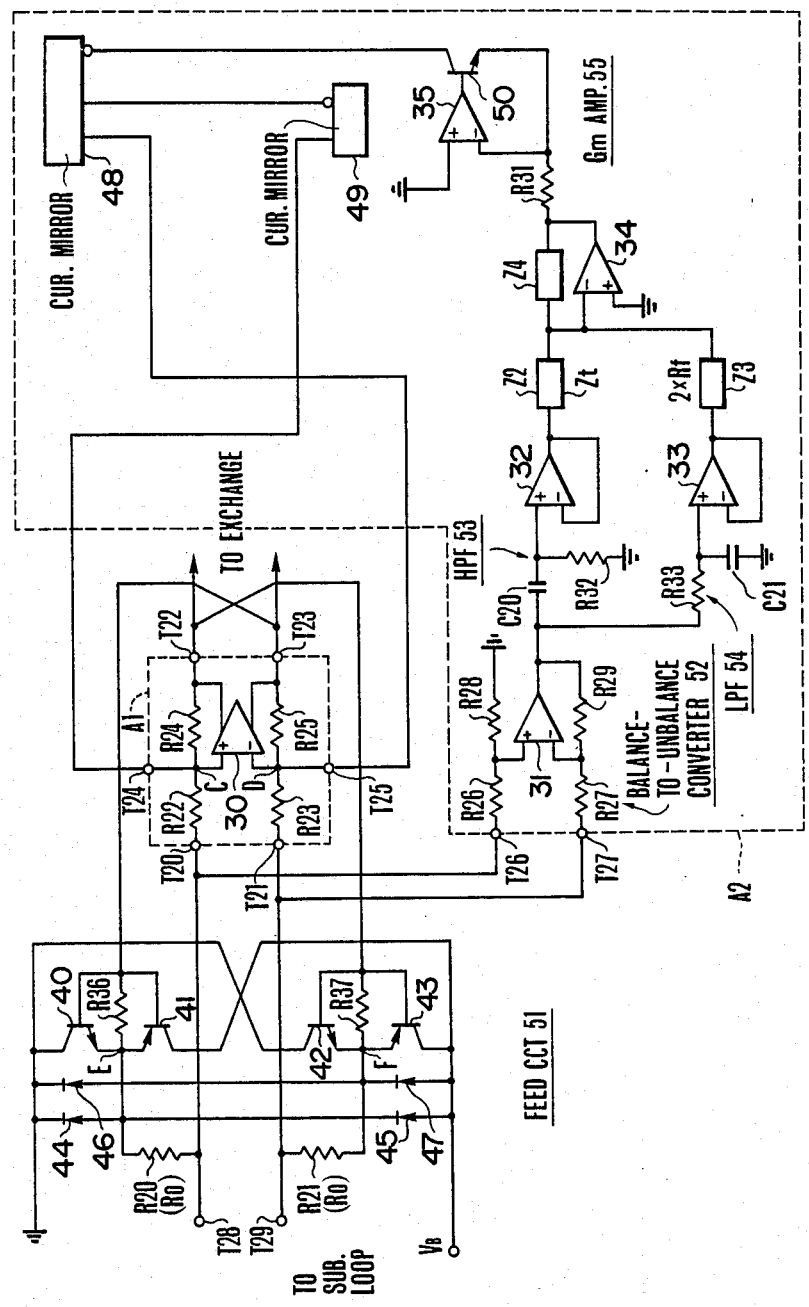
FIG. 3 is a circuit diagram of a modified embodiment of the present invention.

FIG. 3 is an illustration of a second embodiment of the present invention. In subscriber loops the feed (DC) impedance for DC supply and the termination (AC) impedance for speech transmission may differ from each other, and for this reason, they should preferably be treated individually. The second embodiment is suitable for such subscriber loops.

In this embodiment, the first amplifier A1 comprises a balanced operational amplifier 30, a pair of resistors R22, R24 connected in series between terminals T20 and T22, and a pair of resistors R23, R25 connected in series between terminals T21 and T23, with junction C between resistors R22, R24 and junction D between resistors R23, R25 being connected to the inputs of amplifier 30. The outputs of amplifier 30 are connected to terminals T22 and T23 which are cross-coupled to a line feed circuit 51. The input terminals T20 and T21, which are the first inputs of amplifier A1, are connected to line terminals T28 and 29, respectively. The line feed circuit comprises a first pair of series-connected current amplification transistors 40 and 41 of opposite conductivity types and a second pair of series-connected current amplification transistors 42 and 43 of opposite conductivity types. The bases of the transistors of the first pair, which are biased by resistor R36, are coupled together to terminal T23 and the bases of the transistors of the second pair, which are likewise biased by resistor R37, are coupled together to terminal T22. The first and second pairs of these transistors are connected in parallel between ground and voltage supply $V_B$ to develop voltages at junction E between the emitters of transistors 40, 41 and at junction F between the emitters of transistors 42, 43. Reference resistors R20 and R21, each of which has a resistance Ro, are connected from junctions E and F to line terminals T28 and T29, respectively. Protection diodes 44, 45, 46, 47 are connected in shunt with transistors 40, 41, 42, 43, respectively.

The second amplifier A2 comprises a balance-to-unbalance converter 52 connected to terminals T26, T27, a high-pass filter 53, a low-pass filter 54. The inputs of both filters are connected to the output of the converter 52s and their outputs are connected through buffer amplifiers 32, 33 and impedance circuits Z2 and Z3 to a summing amplifier 55. The output of summing amplifier 34 is coupled by resistor R31 to a Gm amplifier 55 whose output is applied to current mirror circuits 48 and 49. Amplifier A2 has input terminals T26 and T27 which are coupled to line terminals T28 and T29, respectively. The outputs of amplifier A2 are connected through the second input terminals T24, T25 of first amplifier A1 to junctions C and D, respectively.

Balance-to-unbalance converter 52 comprises a first pair of resistors R26, R28 connected in series between terminal T26 and ground a second pair of resistors R27 and R29 connected in series between terminals T27 and the output of operational amplifier 31 whose inputs are connected to junctions of resistors R26, R28 and R27, R29. High-pass filter 53, formed by capacitor C20 and resistor R32, passes the speed signal that is the high frequency components of the input signal from the converter 52 through buffer amplifier 32 and impedance element Z2 having a desired impedance Zt and a further impedance element Z4 which is coupled in a feedback path between the output and one input of summing amplifier 34. The impedance elements Z2, Z4 and summing amplifier 34 combine to produce a synthesized impedance Zt across terminals T28 and T29 for the higher frequency components. Low-pass filter 54, formed by capacitor C21 and resistor R33, passes the lower frequency components of the input signal through buffer amplifier 33 and impedance element having a value $2 \times Rf$ and impedance element Z4, where Rf is the resistance to be synthesized across the line terminals. Impedance elements Z3, Z4 and summing amplifier 34 combine to synthesize a DC feed resistance across terminals T28 and T29 for the lower frequency components.

The Gm amplifier 55 comprises an operational amplifier 35 having an input coupled to the output of summing amplifier 34 by resistor R31, the output of amplifier 35 being connected to the base of a transistor 50 whose emitter-to-collector path is connected in a circuit from the resistor R31 to an input of current mirror circuit 48. Current mirror circuits 48 and 49 are coupled so that they provide a pair of currents to the inputs of operational amplifier 30. Since the amplifier 30 are supplied with current inputs through terminals T24 and T25, the first amplifier A1 has the dimension of impedance from terminals T24, T25 to terminals T22, T23.

Figure 4:
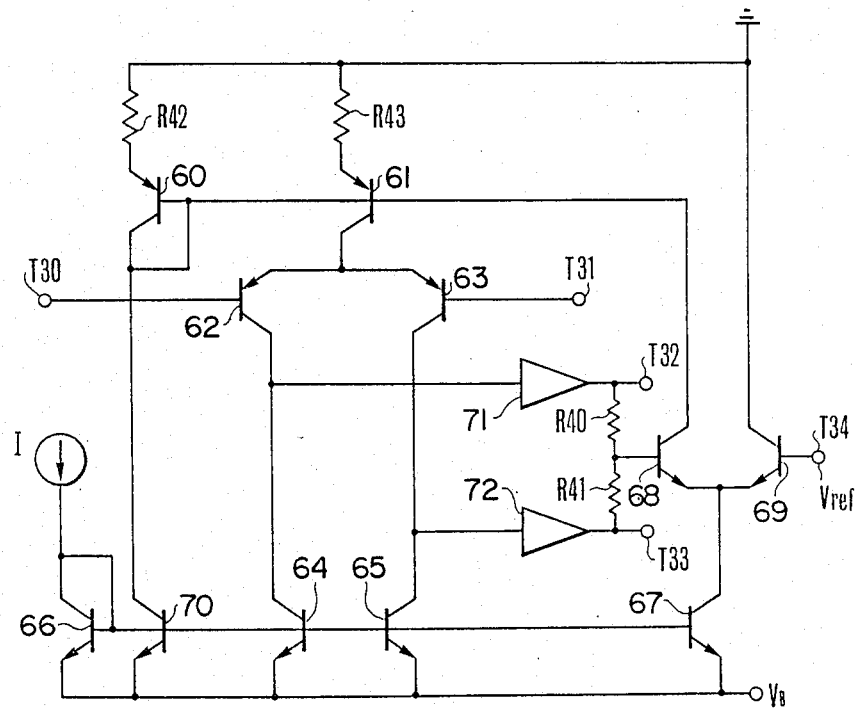
FIG. 4 is a circuit diagram of the first amplifier of FIGS. 2 and 3.

FIG. 4 shows a preferred embodiment of the balanced amplifiers 20 and 30. Transistors 61, 62, 63, 64 and 65 and a resistor R43 constitute a first stage differential amplifier, with the bases of transistors 62 and 63 being connected to input terminals T30 and T31 of the balanced amplifier. Differential outputs, derived from the collectors of transistors 62, 63, are amplified by linear amplifiers 71 and 72 and delivered to output terminals T32 and T33 which are coupled by a series combination of resistors R40 and R41, a junction of which is coupled to the base of a transistor 68. Transistor 68 is thus biased to a voltage which is a midpoint value of the differential outputs. This voltage is compared with a reference voltage Vref applied to the base of a transistor 69 which is connected to transistor 68 to form a second stage differential amplifier configuration with a transistor 67. A differential voltage developed across the correctors of transistors 68 and 69 is applied to the base of transistor 61 of the first stage to compensate for any in-phase variations which might develop across the input terminals T30 and T31. Resistor R42, transistors 60, 70, 66 and a constant current source I bias the bases of transistors 64, 65, 67 and 61.

What is claimed is:

1. A subscriber line interface circuit having a pair of line terminals adapted to be connected to a subscriber line, comprising:
    a first amplifier having a first pair of input terminals coupled to said pair of line terminals, a second pair of input terminals and a pair of output terminals adapted to be connected to a telecommunication exchange, said first amplifier having a unity gain over a path from said first pair of input terminals to said pair of output terminals and a gain K over a path from said second pair of input terminals to said pair of output terminals;
    a pair of reference resistors connected from said pair of output terminals to said pair of line terminals, each of said reference resistors having a resistance Ro; and
    a second amplifier connected from said pair of line terminals to said second pair of input terminals, said second amplifier having a transfer function $-Ro/K \cdot Zt$, where Zt is an impedance to be synthesized across said pair of line terminals.

2. A subscriber line interface circuit as claimed in claim 1, wherein said reference resistors are cross-coupled from said output terminals to said line terminals.

3. A subscriber line interface circuit as claimed in claim 1, wherein said first amplifier comprises a single operational amplifier.

4. A subscriber line interface circuit as claimed in claim 3, wherein said first amplifier comprises a resistor network and wherein said operational amplifier is provided with a pair of input terminals and a pair of output terminals which are connected with said resistor network in a balanced circuit configuration.

5. A subscriber line interface circuit as claimed in claim 1, wherein said second amplifier comprises a resistor network and an operational amplifier having a pair of input terminals and an output terminal which are connected with said resistor network in an unbalanced circuit configuration.

6. A subscriber line interface circuit as claimed in claim 5, wherein said second amplifier further comprises means coupled to be responsive to the output of said operational amplifier to generate a pair of signals of opposite polarities and applying said pair of signals to said second pair of input terminals of said first amplifier.

7. A subscriber line interface circuit as claimed in claim 5, wherein said second amplifier further comprises:
    high-pass filter means coupled to the output of said operational amplifier for passing a higher frequency component of the signals in said subscriber line;
    low-pass filter means coupled to the output or said operational amplifier for passing a lower frequency component of said signals in said subscriber line;
    first impedance means having the impedance Zt connected to the output of said high-pass filter means;
    second impedance means having a resistance value 2Rf, where Rf is a resistance to be synthesized across said line terminals; and
    means for summing the outputs of said first and second impedance means.

8. A subscriber line interface circuit as claimed in claim 7, further comprising a pair of current mirror circuits responsive to an output signal from said summing means and applying output signals of said pair of current mirror circuits to said second pair of input terminals of said first amplifier.

* * * * *